Figure 1:
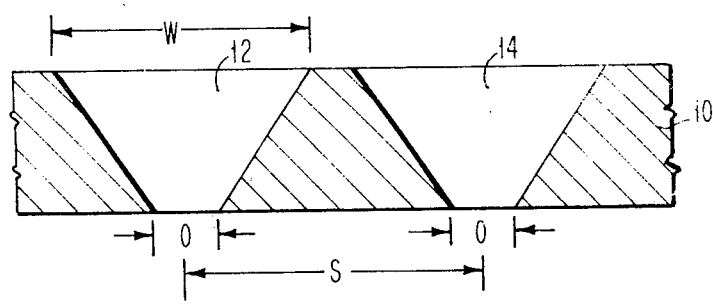

United States Patent [19]

Kurth

[11] 4,169,008
[45] Sep. 25, 1979

[54] PROCESS FOR PRODUCING UNIFORM NOZZLE ORIFICES IN SILICON WAFERS

[75] Inventor: Richard H. Kurth, Palo Alto, Calif.

[73] Assignee: International Business Machines Corporation, Armonk, N.Y.

[21] Appl. No.: 925,126

[22] Filed: Jul. 17, 1978

Related U.S. Application Data

[63] Continuation of Ser. No. 805,675, Jun. 13, 1977, abandoned.

[51] Int. Cl.² .................................... H01L 21/308
[52] U.S. Cl. .................................... 156/600; 134/2; 156/644; 156/653; 156/657; 156/661; 346/75
[58] Field of Search ............... 156/626, 644, 647, 653, 156/657, 661, 662, 345, 600; 346/75; 356/172; 134/2

[56] References Cited

U.S. PATENT DOCUMENTS

| | | | |
|---|---|---|---|
| 3,752,589 | 8/1973 | Kobayashi | 356/172 |
| 3,921,916 | 11/1975 | Bassous | 346/75 |
| 3,949,410 | 4/1976 | Bassous et al. | 346/75 |
| 4,007,464 | 2/1977 | Bassous et al. | 239/601 |

OTHER PUBLICATIONS

Bassous et al, "Fabricating Long Arrays of Nozzles in Large Diameter Wafers", *IBM Tech. Disclosure Bulletin*, vol. 19, No. 6, 11/76, pp. 2311–2312.

Leone et al, "Fabricating Shaped Grid and Aperture Holes", *IBM Tech. Disclosure Bulletin*, vol. 14, No. 2, 7/71, pp. 417–418.

*Primary Examiner*—Jerome W. Massie
*Attorney, Agent, or Firm*—George E. Roush

[57] ABSTRACT

Nozzle plates for ink jet recording are produced by etching through silicon and like monocrystalline material wafers which frequently are non-uniform in thickness. The "100" plane surfaces of the wafers are coated with etchant masking material after which a nozzle array pattern is defined on the obverse surface and a similar, but larger and less exacting, aperture array of the same pattern is defined on the reverse surface. The silicon wafer as thus exposed is anisotropically etched from the reverse substantially through to the obverse and thereafter etched completely through the wafer from the obverse by the same anisotropic process. The lateral walls of the nozzles are substantially in the "111" plane of the wafers. The masking material is then stripped from the wafer.

4 Claims, 2 Drawing Figures

PROCESS FOR PRODUCING UNIFORM NOZZLE ORIFICES IN SILICON WAFERS

The instant U.S. patent application is a continuation of a copending U.S. patent application Ser. No. 805,675, filed on the 13th day of June, 1977 and abandoned upon the filing of the instant application.

The invention parallels the inventions described in U.S. patent applications Ser. Nos. 727,831, filed on the 29th day of Sept. 1976, issued as U.S. Pat. No. 4,059,480 on the 22nd day of Nov., 1977, and 781,616, filed on the 28th day of Mar. 1977, issued as U.S. Pat. No. 4,066,491 on the 3rd day of Jan., 1978, of Gerhard Trippel and Wolf-Dieter Ruh for "Method of Forming Viaducts in Semiconductor Material" and "Method of Simultaneously Etching Tapered Viaducts in Semi-conductor Material" respectively.

The invention relates to a method of making small viaducts or "through-holes" in semiconductor plates, and it particularly pertains to the making of such viaducts to be used particularly as nozzles for ink jet printers where the dimensions of the orifices are required to be substantially uniform.

In ink jet printing, a series of ink droplets is projected against paper or some other record medium. The ink is projected through a nozzle or several closely adjacent nozzles arranged in a wall of a container of ink by vibrating the ink, for example, by means of piezo electric crystal. Thus ink droplets are formed at a distance outside the nozzle which are selectively charged at the moment of their generation by an electric charging electrode. When one single nozzle is used, the drops are deflected more or less strongly by a constant deflection field in that the charge which is applied to the drops by a means of the charging electrode varies in its amplitude. In ink jet printing with a multiple of nozzles, all nozzles project droplets simultaneously, and a charging electrode is arranged in front of each nozzle in the droplet formation area. A constant deflection field deflects the droplets that have received a charge from the charging electrode, in such a manner that they do not reach the paper. Only the uncharged droplets fly in a straight line towards the paper and form the characters. Ink jet printers of the first type with one nozzle are described, for example, in U.S. Pat. No. 3,569,275. Ink jet printers with several parallel nozzles are described in U.S. Pat. No. 3,373,437.

High quality ink jet printing demands that the individual droplets and thus the spots made when the drops impinge on the paper, are sufficiently small and closely adjacent so that they are no longer recognizable as individual droplets. In order to obtain this result, 80 drops or more are required for each centimeter of length, and each drop is to have a diameter not greater than 0.175 mm. In order to achieve this, each nozzle orifice should have a diameter of not more than 0.05 mm, and with multiple nozzles the distance from orifice to orifice should be in the order of 0.25 mm or smaller if possible.

The prior art contains suggestions for making ink jet nozzle plates of semiconductor material by etching processes. The closest art probably is found in the following U.S. patents:

| | | | |
|---|---|---|---|
| 3,921,916 | 11/1975 | Bassous | 239/601 |

-continued

| | | | |
|---|---|---|---|
| 4,007,464 | 2/1977 | Bassous et al | 239/601 |

And in the published literature:
R. A. Leone and C. H. Ting, "Fabricating Shaped Grid and Aperture Holes," IBM Technical Disclosure Bulletin Vol. 14, No. 2, July 1971, pp. 417–418.

The patent to Bassous is directed to a nozzle for ink jet printing and a method of making it is described. The front side of a silicon wafer is first anisotropically etched from the front side of silicon wafer straight through the back side thereof. The process according to the invention and its advantageous accomodation of uneven semiconductor wafers is clearly not found.

The publication is directed to a nozzle plate made by fabricating holes in a silicon substrate by first anisotropically etching from the front side of the substrate to a selected depth therein, and then anisotropically etching from the back side thereof to the hole formed by the first etching step. This represents probably the closest art, however, the simple process according to the invention and the unobvious operation thereof appears to have been completely overlooked.

According to the invention, the objects indirectly referred to hereinbefore and those that will appear as the specification progresses obtain in a process for fabricating nozzle plates and the like from mono-crystalline semiconductor wafers with substantially uniform nozzle orifices despite variations in thickness of the wafers. The first step, usually performed by a vendor, is the production of a semiconductor wafer with the major surfaces lying substantially in the "100" plane. The semiconductor crystalline structure then has internal "111" planes at a convenient angle with respect to the "100" planes, for example, in crystalline silicon at an angle of 54.°7. A suitable anisotropic etchant is used to etch pyramidal cavities in the semiconductor wafer. An anisotropic etchant works much more normally to the "100" plane than it does laterally or parallel to the "100" plane and thus it works very much less at the "111" plane. Hence, the action of the etchant leaves pyramidal nozzle surfaces. In accordance with the process according to the invention, the wafer is first coated with etchant masking material on both the obverse and reverse major surfaces. Apertures are then made in the masking material on the reverse in the locations where the nozzles are desired and etching begun as described above. The etching is halted at a time when the etchant is well along toward the obverse surface, and indeed some of the formative nozzles may be through the obverse. At this time apertures are opened in the masking material on the obverse. The apertures opened are dimensioned to form the orifices of the nozzles. These apertures are smaller than those opened on the reverse and also smaller than the desired orifices by a predetermined amount predictable on a degree of under-cutting in the etching process. The smaller apertures are readily aligned with the larger apertures by shining light through the partially etched nozzles and merely placing the mask for the orifice apertures in reasonable alignment. Anisotropic etching next results in frustro-pyramidal cavities extending from the obverse meeting the frustro-pyramidal pits already extending from the reverse at levels intermediate of the obverse and reverse surfaces of the wafer. Although it might be expected that the anisotropic etching process should stop at this stage because the "100" plane is no longer exposed to the etchant, the etching proceeds to the final stage wherein the nozzles are substantially pyramidal in configuration; the orifices are the only feature limiting the pyramidal configuration. Thus this unobvious progress of the process according to the invention results in a much improved nozzle plate made by a novel process of relaxed requirements.

Figure 2:
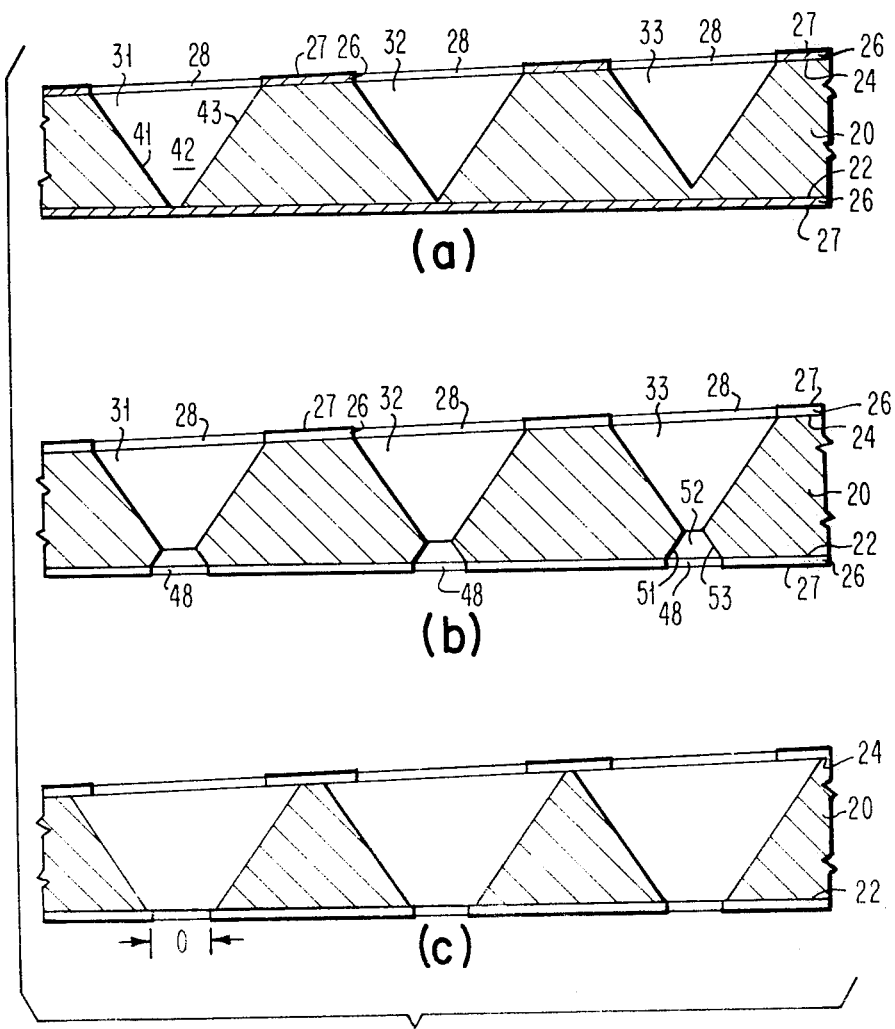

In order that full advantage obtain in the practice of the invention, a preferred embodiment thereof, given by way of example only, is described in detail hereinafter with reference to the accompanying drawing, forming a part of the specification, and in which:

FIG. 1 depicts a cross-section of a nozzle plate made by a process according to the invention; and FIG. 2—sections (a), (b) and (c) being taken together—show three stages of the nozzle plate development as it evolves by the process according to the invention.

A cross-section of a small portion of a nozzle plate of the type formed by a process according to the invention is shown in FIG. 1. A wafer 10 of silicon, or like material is etched, or otherwise processed subtractively, to form viaducts 12, 14. These viaducts will serve in ink jet applications as nozzles where it is important that the orifices of all nozzles have the same critical dimension O within a close tolerance and the spacings S between orifices have the same critical dimensioning. For example, in one application the wafer is 1.15 mm (0.045 in) thick in which the desired orifice dimension is 0.020 mm (0.0008 in.) and the spacing is 0.200 mm. (0.0080 in). Although the other dimensions are important, they are much less critical in most cases. Non-uniformity of the thickness results in non-uniformity of the other dimensions in subtractive material processing, but the process according to the invention is substantially insensitive to variations in thickness as will be seen hereinafter. Three stages in a process according to the invention for forming an array of nozzles of uniform orifice and interorifice spacing dimensions are illustrated in FIG. 2 (a), (b) and (c).

A small portion 20 of a wafer of silicon, or like material, having variations in thickness inadvertently resulting from slicing, lapping and polishing operations is shown in cross-section. In the interest of clarity, irregularity in thickness is illustrated only by the cuniform configuration. Those skilled in the art will readily recognize the approach to be taken in applying the teaching of the invention to the application at hand.

The wafer 20 is supplied with the obverse surface 22 lying within ±1° of a plane known to the artisan as the "100" plane. This "100" plane is simply defined in terms of mono-crystalline silicon electro-physical geometry as a plane parallel to surfaces of the parallel-piped structure of the crystal. The reverse surface 24 is likewise within ±1° of another "100" plane or very close thereto in view of the skew due to the cuniform configuration. Another plane of crystalline silicon, diagonally of the "100" plane, and known to the artisan as the "111" plane, lies at an angle, for silicon, of 54.°7 to the "100" plane. The relationship of this "111" plane to the "100" plane in accordance with the invention will become more apparent hereinafter.

Silicon-dioxide is grown, or otherwise deposited, on both obverse and reverse surfaces of the wafer 20. The SiO2 layers 26 in turn are covered by photolithic etchant masking material 27. The SiO2 layers are interposed because in most applications the photoresist alone is unable to stand up to the etchant; otherwise the SiO2 layer is omitted. The obverse is considered the side on which the orifices of the nozzles are to appear; otherwise there is little difference. A pattern of apertures 28, substantially as the pattern of orifices desired, is photolithographically produced on the reverse leaving the surface 24 of the silicon wafer 20 exposed. An anisotropic etchant is applied and pyramidal nozzles 31, 32, 33 are begun. The anisotropic etchant is chosen from a number commercially available that etch silicon much faster in the direction normal to the "100" plane than in the lateral direction toward the "111" plane. Thus as the etchant works a four-sided pyramidal opening appears with the sides 41, 42, 43 (and 44 not shown because it is in the foreground) each substantially lying in a "111" plane.

The etching is fairly predictable and fairly uniform with a given supply of wafers, however, irregularities, especially in thickness of the wafer, bring some uncertainty into the process. The etching from the reverse is usually allowed to proceed partially until a cross-section such as that shown in FIG. 2(a) obtains. A pattern of apertures 48 is photolithographically produced in the obverse. The apertures 48 in this pattern are smaller than the apertures 28. Precision alignment in registering the aperture patterns is thus obviated. The patterns are readily registered by shining light through the wafer and aligning the mask for the apertures 48 so that three apertures 48 are within the corresponding apertures 28 as determined by the light coming through the wafer. These apertures are dimensioned to allow for some undercut in the etching process. For example, apertures 28 of 0.015 mm (0.0006 in) are made for a resulting nozzle orifice of 0.020 mm (0.0008 in).

From the obverse, the anisotropic etching process is set up as before. The nozzles now take the shape as illustrated by FIG. 2(b) wherein two four-sided frustopyramidal pits intesect within the wafer 20. The etching does not stop, however, but continues, with the "111" planes of the silicon material and the etchant masking material being the major limiting factors, to the full etch phase. The masking material and the SiO2 layers are then stripped off, leaving the structure much as depicted in FIG. 1 except for irregular thickness but with orifices of uniform dimensions.

The materials used for etching, for masking and for stripping and the like are fully described in the prior art hereinbefore mentioned, although the advantageous simplicity brought about by the novel process according to the invention is obscured somewhat by the marked detail. Those skilled in the art will readily apply the teaching of the invention to the application at hand using only the necessary teaching of the prior art discussed hereinbefore.

While the invention has been described in terms of a preferred process and alternatives have been suggested, it should be clearly understood that those skilled in the art will make further changes without departing from the spirit and scope of the invention as defined in the appended claims concluding the specification.

The invention claimed is:

1. A process for producing an ink jet nozzle plate in the form of a monocrystalline silicon wafer having a multiple of nozzles arranged between obverse and reverse surfaces of said wafer which are subject to non-uniform thickness therebetween and having orifices of substantially uniform dimensions in said obverse surface which lies substantially in a 100 plane of said wafer comprising the steps of:

coating said wafer with etchant masking material including said obverse and reverse surfaces, forming apertures in said masking material on said reverse surfaces at locations corresponding to the desired locations of the nozzles to be formed, etching said wafer from said reverse surface with anisotropic etchant in the areas within said apertures to points near, at, or effectively beyond said obverse surface as dictated by variations in said non-uniform thickness, forming apertures in said masking material on said obverse surface smaller than the apertures formed in masking material on the reverse surface substantially in registry with said apertures on said reverse surface at locations corresponding to the desired locations of the orifices of said nozzles to be formed and subtending those apertures in said reverse surface, and etching said wafer from said obverse surface with anisotropic etchant in the areas within said apertures on said obverse surface and continuing the etching as originating from the reverse, thereby producing frustro-pyramidal nozzles with plane surface sides extending entirely through said wafer in 111 planes of said wafer with orifices of substantially uniform dimensions in said obverse surfaces determined by said apertures formed on said obverse surface.

2. A process for producing an ink jet nozzle plate in the form of a monocrystalline silicon wafer having a multiple of nozzles arranged between obverse and reverse surfaces of said wafer which are subject to non-uniform thickness therebetween and having orifices of substantially uniform dimensions in said obverse surface which lies substantially in a 100 plane of said wafer comprising the steps of:

coating said wafer with insulating material including said obverse and reverse surfaces, coating said insulating material with etchant masking material, forming apertures in said masking material on said reverse surface at locations corresponding to the desired locations of the nozzles to be formed, forming apertures in said insulating material on said reverse surface through said apertures in the masking material, etching said wafer from said reverse surface with anisotropic etchant in the areas within said apertures to points near, at, or effectively beyond said obverse surface as dictated by variations in said non-uniform thickness, lighting said apertures and said wafer as etched for locating smaller apertures in said masking material on said obverse surface at locations corresponding to the desired locations of the orifices of said nozzles to be formed, forming apertures in the masking material on the obverse surface smaller than the apertures formed in the masking material on the reverse surface and subtending the apertures on the reverse surface, forming apertures in the insulating material on the obverse surface through said smaller apertures and etching said wafer from said obverse surface with anisotropic etchant in the areas within said apertures in said insulating material on said obverse surface and continuing the etching as originating from the reverse, thereby producing frusto-pyramidal nozzles with plane surface sides extending entirely through said wafer with orifices of substantially uniform dimensions in said obverse surface determined by said apertures as formed on said obverse surface despite any variations in thickness of said wafer.

3. A process for producing an ink jet nozzle plate as defined in claim 2, and incorporating an initial step of:

producing a semiconductor wafer having the obverse and reverse surfaces lying substantially in the 100. plane.

4. A process for producing an ink jet nozzle plane as defined in claim 2, and incorporating a final step of:

stripping said masking and said insulating material from said wafer.

* * * * *